United States Patent
Kakinuma et al.

(10) Patent No.: US 8,583,073 B2
(45) Date of Patent: *Nov. 12, 2013

(54) MIXER AND FREQUENCY CONVERTING APPARATUS

(75) Inventors: Yuji Kakinuma, Tokyo (JP); Ryoichi Kondo, Tokyo (JP)

(73) Assignee: TDK Corporation, Tokyo (JP)

( * ) Notice: Subject to any disclaimer, the term of this patent is extended or adjusted under 35 U.S.C. 154(b) by 210 days.

This patent is subject to a terminal disclaimer.

(21) Appl. No.: 13/192,823

(22) Filed: Jul. 28, 2011

(65) Prior Publication Data

US 2012/0025926 A1 Feb. 2, 2012

(30) Foreign Application Priority Data

Aug. 2, 2010 (JP) .................................. 2010-173708

(51) Int. Cl.
H04B 1/26 (2006.01)

(52) U.S. Cl.
USPC ............................ 455/323; 455/326; 327/356

(58) Field of Classification Search
USPC .................. 455/113, 313, 323, 326, 330, 333; 327/113, 116, 119, 355, 356
See application file for complete search history.

(56) References Cited

U.S. PATENT DOCUMENTS 8,270,206 B2 * 9/2012 Asatani .......................... 365/158
2009/0243698 A1 10/2009 Kakinuma et al.

FOREIGN PATENT DOCUMENTS

| JP | 2009-128615 | 6/2009 |
| JP | 2009-246615 | 10/2009 |

OTHER PUBLICATIONS

Tulapurkar et al., "Spin-torque diode effect in magnetic tunnel junctions", Nature, vol. 438, No. 7066 (Nov. 17, 2005), pp. 339-342.
Suzuki et al., "Microwave Properties of Spin Injection Devices", Magune, vol. 2, No. 6 (2007). pp. 282-290.

* cited by examiner

*Primary Examiner* — Quochien B Vuong
(74) *Attorney, Agent, or Firm* — Greenblum & Bernstein, P.L.C.

(57) ABSTRACT

A mixer includes an adder that inputs a first high-frequency signal and a second high-frequency signal for local use, adds the first high-frequency signal and the second high-frequency signal, and outputs as an addition signal; a magnetoresistive effect element that includes a fixed magnetic layer, a free magnetic layer, and a non-magnetic spacer layer disposed between the fixed magnetic layer and the free magnetic layer, and is operable when the addition signal has been inputted, to multiply the first high-frequency signal and the second high-frequency signal included in the addition signal using a magnetoresistive effect to generate a multiplication signal; a magnetic field applying unit applying a magnetic field to the free magnetic layer; and a first impedance converting unit that is passive, inputs the multiplication signal outputted from the magnetoresistive effect element, converts the multiplication signal to a lower impedance than an input impedance, and outputs the converted signal.

6 Claims, 4 Drawing Sheets

MIXER AND FREQUENCY CONVERTING APPARATUS

BACKGROUND OF THE INVENTION

1. Field of the Invention

The present invention relates to a mixer that generates a multiplication signal using a magnetoresistive effect element and a frequency converting apparatus equipped with such mixer.

2. Description of the Related Art

A TMR (Tunnel MagnetoResistive) element constructed with a spacer layer formed of a nonmagnetic material between a fixed magnetic layer and a free magnetic layer is known as one example of a magnetoresistive effect element. In a TMR element, spin-polarized electrons flow when a current passes, and the magnetic orientation of the free magnetic layer (i.e., the orientation of electron spin) changes in accordance with the number of spin-polarized electrons that accumulate inside the free magnetic layer. When an attempt is made to change the magnetic orientation of a free magnetic layer that has been disposed in a certain magnetic field, torque will act upon the electron spin so as to restore the electron spin to a stable orientation that is restricted by the magnetic field, and when the electron spin is perturbed with a specific force, oscillation referred to as spin precession will occur.

In recent years, a phenomenon called spin torque ferromagnetic resonance has been discovered whereby when a high-frequency AC current flows in a magnetoresistive effect element such as a TMR element, strong resonance will occur if the frequency of the AC current that flows through the free magnetic layer matches the oscillation frequency of the spin precession that is attempting to restore the magnetic orientation (see non-Patent Document 1). It is also known that when an RF current (i.e., an RF current with a frequency that matches the oscillation frequency (resonant frequency) of the spin precession) is injected into a magnetoresistive effect element in a state where a static magnetic field is being applied to the magnetoresistive effect element from outside and the orientation of the static magnetic field is inclined by a predetermined angle in the fixed magnetic layer to the magnetic orientation of the fixed magnetic layer, the magnetoresistive effect element will function so that a DC voltage in proportion to the square of the amplitude of the injected RF current is generated across both ends of the magnetoresistive effect element, or in other words, a square-law detection function (or the so-called spin torque diode effect) is achieved. It is also known that the square-law detection output of such magnetoresistive effect element will exceed the square-law detection output of a semiconductor pn junction diode under predetermined conditions (see Non-Patent Document 2).

In spite of the above phenomenon of TMR elements being known, no magnetic devices that can put such phenomenon to industrial use are known, and application of such discovery is awaited. By carrying out thorough research, the present applicant focused on the square-law detection function of a magnetoresistive effect element, investigated and already proposed its application in a mixer capable of operating on low local power (see non-Patent Document 1).

Non-Patent Document 1
Nature, Vol. 438, 17 Nov. 2005, pp. 339-342
Non-Patent Document 2
Magune, Vol. 2, No. 6, 2007, pp. 282-290
Patent Document 1
Japanese Laid-Open Patent Publication No. 2009-246615 (see Pages 4 to 8 and FIG. 1)

SUMMARY OF THE INVENTION

However, as a result of continued study of the mixer described above that was proposed by the present applicant, the mixer was found to be susceptible to a phenomenon where the square-law detection output of the magnetoresistive effect element (i.e., the signal level of the multiplication signal of the mixer) dramatically falls when the impedance of the transfer line (signal line) connected to the magnetoresistive effect element is low (for example, when a magnetoresistive effect element is directly connected to a transfer line with a characteristic impedance of 50Ω).

For this reason, to avoid the phenomenon described above, the present applicant has proposed a mixer with a construction where an impedance converting circuit is disposed between a magnetoresistive effect element and transfer lines (hereinafter also referred to as "input transfer lines") of two signals that are inputted into and mixed by the magnetoresistive effect element and where another impedance converting circuit is disposed between the magnetoresistive effect element and the output transfer line of the multiplication signal for the two signals generated by the magnetoresistive effect element (see Japanese Laid-Open Patent Publication 2009-128615). In this publication, both a construction with a passive element and a construction with an active element are proposed as the impedance converting circuits disposed on the input transfer line-side, and a construction that uses an operational amplifier which is an active element is proposed as the impedance converting circuit disposed on the output transfer line-side.

However, since the input impedance of an operational amplifier that is an active element is sufficiently high compared to a 50Ω output transfer line, a large drop in the square-law detection output of the magnetoresistive effect element (i.e., the signal level of the multiplication signal at the mixer) is avoided. On the other hand, since the input impedance of an operational amplifier is characteristic to such operational amplifier, such input impedance will not necessarily match the impedance of the magnetoresistive effect element (i.e., the characteristic impedance of the magnetoresistive effect element). Accordingly, with a mixer where an impedance converting circuit constructed of an operational amplifier is disposed between a magnetoresistive effect element and the output transfer line, due to the high probability of a mismatch between the impedance of the magnetoresistive effect element and the impedance converting circuit constructed of an operational amplifier, there is the problem to be solved of distortion being produced in the multiplication signal outputted to the output transfer line.

The present invention was conceived to solve the problem described above and it is a principal object of the present invention to provide a mixer that is capable of reliably reducing distortion of a multiplication signal outputted from a magnetoresistive effect element to a transfer line and a frequency converting apparatus equipped with such mixer.

To achieve the stated object, a mixer according to the present invention comprises: an adder that inputs a first high-frequency signal and a second high-frequency signal for local use, adds the first high-frequency signal and the second high-frequency signal, and outputs as an addition signal; a magnetoresistive effect element that includes a fixed magnetic layer, a free magnetic layer, and a non-magnetic spacer layer disposed between the fixed magnetic layer and the free magnetic layer, and is operable when the addition signal has been inputted, to multiply the first high-frequency signal and the second high-frequency signal included in the addition signal using a magnetoresistive effect to generate a multiplication signal; a magnetic field applying unit that applies a magnetic field to the free magnetic layer; and a first impedance converting unit that is passive, inputs the multiplication signal outputted from the magnetoresistive effect element, converts the multiplication signal to a lower impedance than an input impedance, and outputs the converted multiplication signal.

According to this mixer, by including the passive impedance converting unit that inputs the multiplication signal outputted from the magnetoresistive effect element with the same input impedance as the impedance of the magnetoresistive effect element and converts and outputs the multiplication signal to an impedance that matches the characteristic impedance of the transfer line disposed between the mixer and the next circuit downstream (that is, an impedance that is equal to the input impedance of the next circuit downstream that is lower than the impedance of the magnetoresistive effect element), even when the impedance of the magnetoresistive effect element and the characteristic impedance of the transfer line described above differ, it is possible to reliably avoid the generation of distortion caused by mismatching of the magnetoresistive effect element and the transfer line and to output the multiplication signal outputted from the magnetoresistive effect element to the transfer line. Also, since extremely little distortion is generated in a passive impedance converting unit itself compared to an active impedance converting unit, it is possible for the passive impedance converting unit to output the multiplication signal from the magnetoresistive effect element to the transfer line with significantly less distortion.

In the mixer according to the present invention, the first impedance converting unit may include one of a transformer-type impedance converting circuit and a resistance-type impedance converting circuit.

In this case, by constructing the passive impedance converting unit from only a transformer-type impedance converting circuit as a passive component, compared to an impedance converting unit that uses resistance, it is possible to minimize the attenuation of the multiplication signal in the impedance converting unit and to output to the transfer line having removed the DC component included in the multiplication signal.

Also, to achieve the stated object, a frequency converting apparatus according to the present invention comprises: the above-described mixer; and a filter passing one frequency out of (f1+f2) and (f1−f2) out of the multiplication signal, where f1 is the frequency of a higher frequency signal out of the first high-frequency signal and the second high-frequency signal and f2 is the frequency of a lower frequency signal.

According to the above frequency converting apparatus, by including the mixer described above, it is possible to achieve the standalone effects of the mixer itself described above and by including the filter passing one frequency out of (f1+f2) and (f1−f2) out of the multiplication signal, where f1 is the frequency of a higher frequency signal out of the first high-frequency signal and the second high-frequency signal and f2 is the frequency of the lower frequency signal, it is possible, by using a filter that passes the frequency (f1+f2), to cause the frequency converting apparatus to function as an upconverting apparatus, and conversely by using a filter that passes the frequency (f1−f2), to cause the frequency converting apparatus to function as a down-converting apparatus.

Also, the frequency converting apparatus according to the present invention may further comprise a signal generating unit that generates the second high-frequency signal, wherein the signal generating unit may includes: a second magnetoresistive effect element including a fixed magnetic layer, a free magnetic layer, and a non-magnetic spacer layer disposed between the fixed magnetic layer and the free magnetic layer; a second magnetic field applying unit that applies a magnetic field to the free magnetic layer of the second magnetoresistive effect element; and a current supplying unit that supplies a DC current to the second magnetoresistive effect element, wherein the second high-frequency signal may be generated by spin injection self-oscillation by the second magnetoresistive effect element.

By using this construction, it is possible to match the impedance of the second high-frequency signal outputted from the signal generating unit to the impedance of the magnetoresistive effect element that constructs the mixer without using an impedance converting unit (i.e., without disposing an impedance converting unit in the mixer).

It should be noted that the disclosure of the present invention relates to a content of Japanese Patent Application 2010-173708 that was filed on 2 Aug. 2010 and the entire content of which is herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a mixer and a frequency converting apparatus will now be described with reference to the attached drawings.

First, the constructions of a mixer 1 and a frequency converting apparatus 100 that includes the mixer 1 will be described with reference to the drawings. Note that an example where the frequency converting apparatus 100 has been applied to a receiver apparatus RX will be described as an example.

Figure 1:
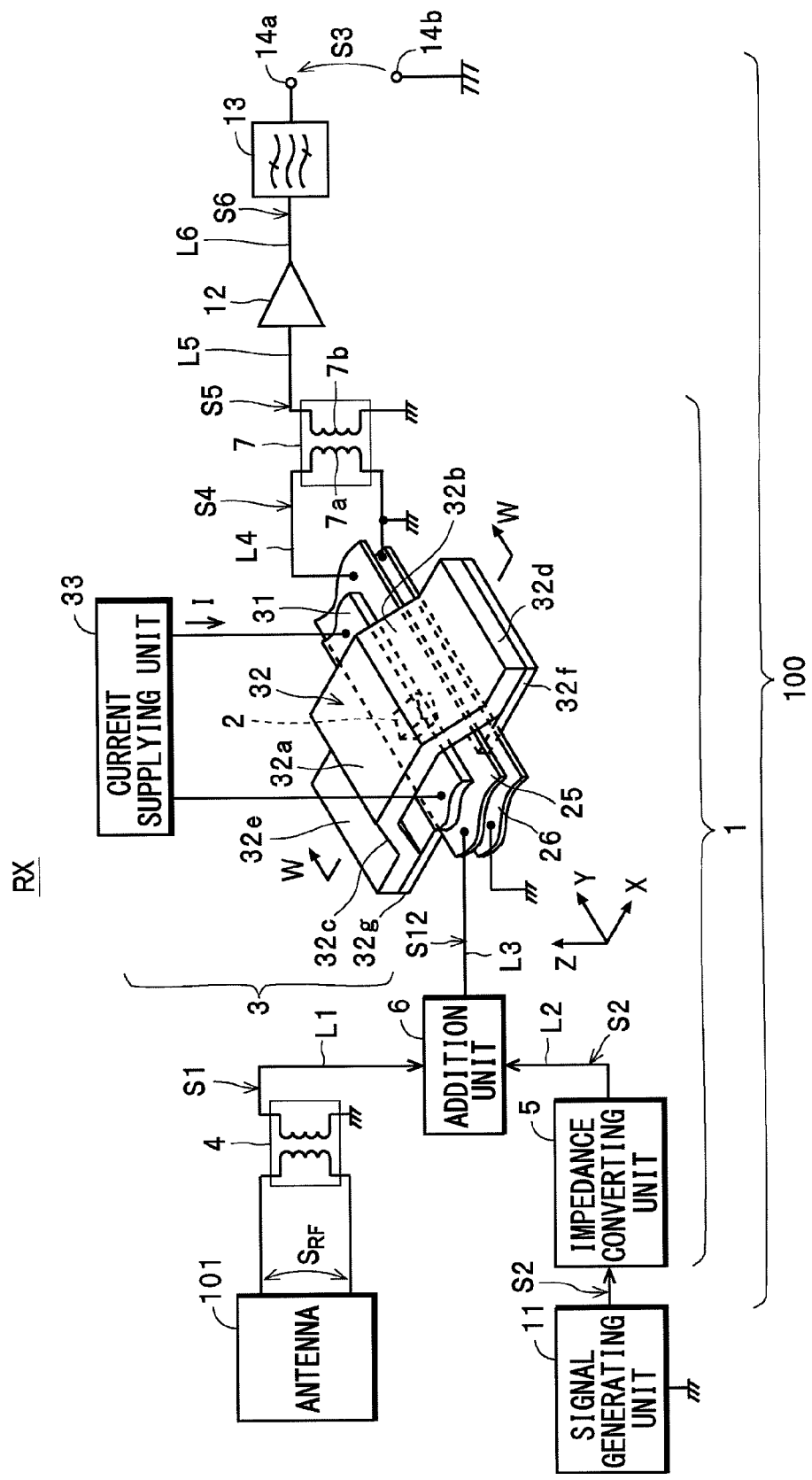
FIG. 1 is a diagram showing the construction of a frequency converting apparatus.

The frequency converting apparatus 100 shown in FIG. 1 and an antenna 101 together construct the receiver apparatus RX. The frequency converting apparatus 100 is disposed at a high-frequency stage of the receiver apparatus RX that receives an RF signal $S_{RF}$ (first high-frequency signal) outputted from the antenna 101 and functions so as to convert the frequency f1 of the RF signal $S_{RF}$ to the frequency fm of a multiplication signal S3. As one example, the frequency converting apparatus 100 includes the mixer 1 and a signal generating unit 11, an amplifier 12, a filter 13, and output terminals 14a, 14b (hereinafter collectively referred to as the output terminals 14 when no distinction is required).

As one example, the signal generating unit 11 generates and outputs a −15 dBm±5 dBm local signal S2. So long as it is capable of outputting the local signal S2 described above, the signal generating unit 11 may use an arbitrary construction. As described in Non-Patent Document 2 ("Magune") mentioned earlier, it is known that a magnetoresistive effect element will self-oscillate with a high frequency (i.e., the precessional frequency of the magnetoresistive effect element) when a DC current and an external magnetic field are simultaneously applied. In the present embodiment, using this characteristic of a magnetoresistive effect element, the signal generating unit 11 is constructed using a magnetoresistive effect element.

Figure 2:
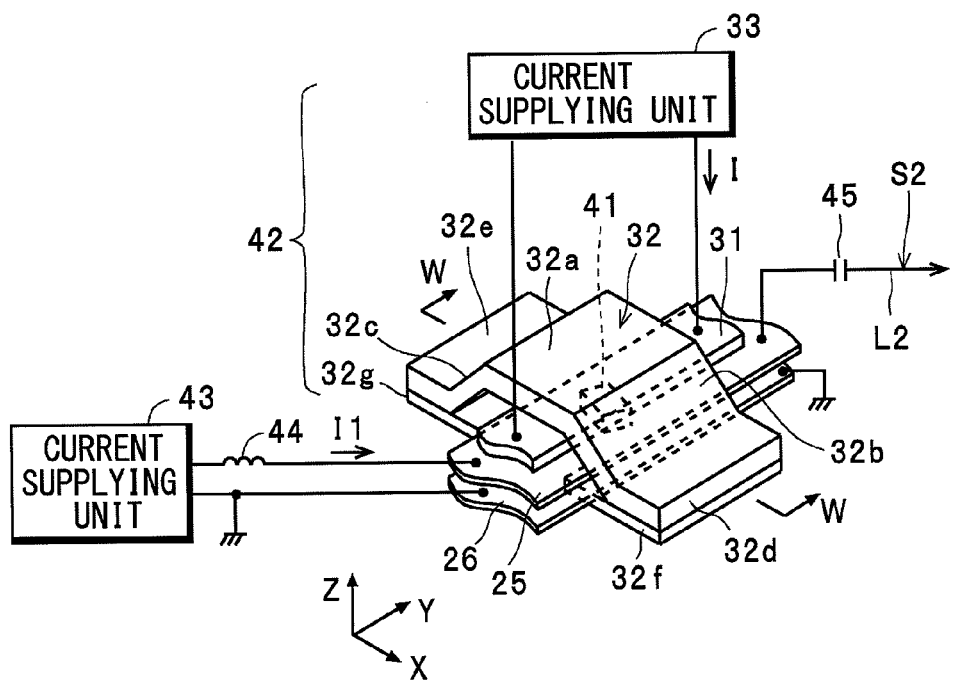
FIG. 2 is a diagram showing the construction of a signal generating unit in FIG. 1.

More specifically, as shown in FIG. 2, the signal generating unit 11 includes a magnetoresistive effect element (second magnetoresistive effect element) 41, a magnetic field applying unit (second magnetic field applying unit) 42, a current supplying unit 43, a coil 44, and a capacitor 45.

Figure 3:
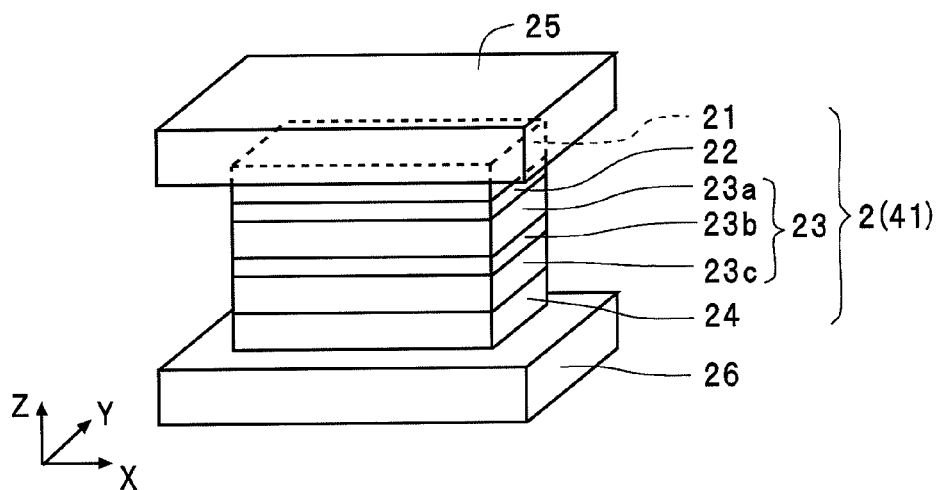
FIG. 3 is a perspective view of the periphery of a magnetoresistive effect element (TMR element)
Figure 5:
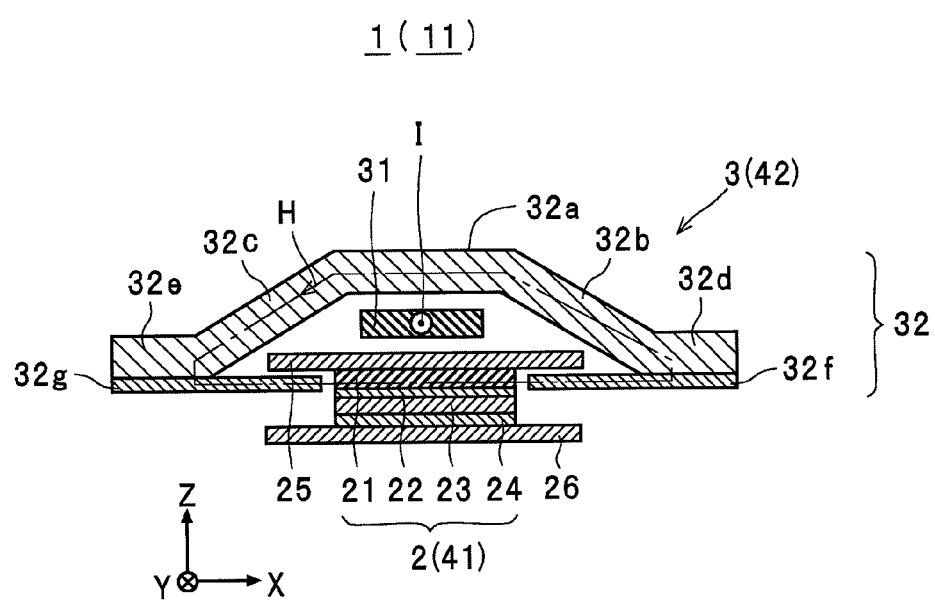
FIG. 5 is a cross-sectional view taken along a line W-W in FIGS. 1 and 2.

As one example, the magnetoresistive effect element 41 is constructed of a TMR element that includes a free magnetic layer 21 as shown in FIGS. 3 and 5. More specifically, the magnetoresistive effect element 41 includes the free magnetic layer 21, a spacer layer 22, a fixed magnetic layer 23, and an antiferromagnetic layer 24 that are laminated in the mentioned order and are disposed between an upper electrode 25 and a lower electrode 26 in a state where the free magnetic layer 21 is connected to the upper electrode 25 and the antiferromagnetic layer 24 is connected to the lower electrode 26. Here, the free magnetic layer 21 is constructed of a ferromagnetic material as a magnetism-sensing layer. The spacer layer 22 corresponds to a nonmagnetic spacer layer, and is constructed of a nonmagnetic material that is an insulator so as to function as a tunneling barrier layer. Note that the spacer layer 22 is normally formed with a thickness of 1 nm or below. As shown in FIG. 2, The lower electrode 26 is also connected to ground.

As one example, as shown in FIG. 3, the fixed magnetic layer 23 is constructed by forming a ferromagnetic layer (second magnetic layer) 23a whose magnetic orientation is fixed, a nonmagnetic layer 23b made of a metal such as ruthenium (Ru), and another ferromagnetic layer (first magnetic layer) 23c whose magnetic orientation is fixed in the opposite direction to the magnetic orientation of the ferromagnetic layer 23a, such layers being laminated in the mentioned order so that the ferromagnetic layer 23c is positioned above the antiferromagnetic layer 24. In this case, the respective magnetic orientations of the pair of ferromagnetic layers 23a, 23c are set so as to be perpendicular to the thickness (i.e., the Z axis direction) of the magnetoresistive effect element 41. The antiferromagnetic layer 24 is exchange-coupled with the ferromagnetic layer 23c at the bottom of the fixed magnetic layer 23.

Figure 4:
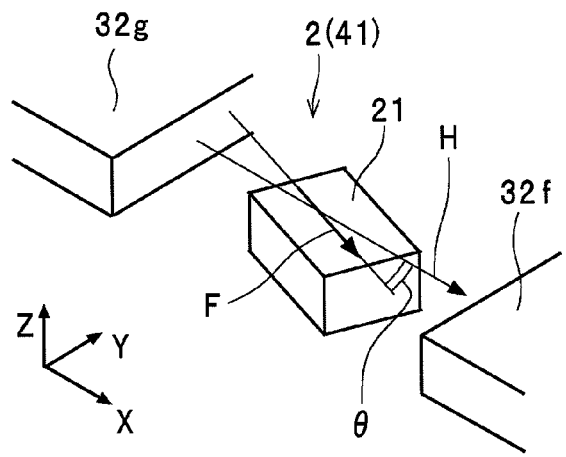
FIG. 4 is a perspective view of the periphery of a free magnetic layer of the magnetoresistive effect element.

Also, as shown in FIG. 4, in order to facilitate resonance of the magnetic orientation of the free magnetic layer 21, the positional relationship between the magnetoresistive effect element 41 and the magnetic field applying unit 42 is set in advance so that the orientation of the axis of easy magnetization F of the free magnetic layer 21 and the orientation of the magnetic field H applied from the magnetic field applying unit 42 (described later) intersect at a predetermined angle θ (preferably an angle in a range of 5° to 175°, inclusive, and more preferably 90°) on an X-Y plane.

As shown in FIGS. 2 and 5, the magnetic field applying unit 42 includes a magnetic field generating wire 31, a magnetic yoke 32, and a current supplying unit 33. As shown in FIG. 5, the magnetic field generating wire 31 is disposed above the magnetoresistive effect element 41 with the upper electrode 25 in between. The magnetic yoke 32 includes a top magnetic body 32a, side magnetic bodies 32b, 32c, lower magnetic bodies 32d, 32e, and bottom magnetic bodies 32f, 32g. The top magnetic body 32a is disposed above the magnetic field generating wire 31. The side magnetic body 32b is disposed on one side of the magnetic field generating wire 31 (as one example, on the right side in FIG. 5) and is connected to the top magnetic body 32a. The side magnetic body 32c is disposed on the other side of the magnetic field generating wire 31 (as one example, on the left side in FIG. 5) and is also connected to the top magnetic body 32a. The lower magnetic body 32d is disposed on one side of the magnetoresistive effect element 41 (as one example, on the right side in FIG. 5) and is connected to the side magnetic body 32b. The lower magnetic body 32e is disposed on the other side of the magnetoresistive effect element 41 (as one example, on the left side in FIG. 5) and is connected to the side magnetic body 32c. By using the stated construction, the lower magnetic body 32e, the side magnetic body 32c, the top magnetic body 32a, the side magnetic body 32b, and the lower magnetic body 32d are connected in the mentioned order so as to form an overall band shape and are disposed above the magnetoresistive effect element 41 so as to span the magnetic field generating wire 31 as shown in FIG. 1.

As shown in FIGS. 2 and 5, the bottom magnetic body 32f is disposed below the lower magnetic body 32d in a state where the bottom magnetic body 32f is connected to the lower magnetic body 32d. An end portion on the magnetoresistive effect element 41 side of the bottom magnetic body 32f protrudes into a gap between the upper electrode 25 and the lower electrode 26 of the magnetoresistive effect element 41 as far as the periphery of one side surface of the free magnetic layer 21 of the magnetoresistive effect element 41 but is insulated from the upper electrode 25 and the lower electrode 26. The bottom magnetic body 32g is disposed below the lower magnetic body 32e in a state where the bottom magnetic body 32g is connected to the lower magnetic body 32e. An end portion on the magnetoresistive effect element 41 side of the bottom magnetic body 32g also protrudes into a gap between the upper electrode 25 and the lower electrode 26 as far as the periphery of the other side surface of the free magnetic layer 21 of the magnetoresistive effect element 41 but is insulated from the upper electrode 25 and the lower electrode 26.

With the construction described above, the magnetic yoke 32 forms a closed magnetic path for the magnetic field that is generated in the region of the magnetic field generating wire 31 when a current I flows in the magnetic field generating wire 31. As shown in FIG. 4, the magnetic yoke 32 applies a magnetic field H to the free magnetic layer 21 of the magnetoresistive effect element 41 disposed at the position of a gap in the closed magnetic path (i.e., the gap between the pair of bottom magnetic bodies 32f, 32g). Also, in the present embodiment, as one example, the magnetic field generating wire 31 and the magnetic yoke 32 of the magnetic field applying unit 42 described above are formed together with the magnetoresistive effect element 41 on a silicon wafer in an IC form by a well-known semiconductor manufacturing process.

The current supplying unit 33 that constructs the magnetic field applying unit 42 is connected to both ends of the magnetic field generating wire 31 that protrude from both sides of the top magnetic body 32a and supplies the current I to the magnetic field generating wire 31. The current supplying unit 33 is constructed so that the magnitude of the current I can be changed. Accordingly, by changing the magnitude of the current I outputted from the current supplying unit 33, the magnetic field applying unit 42 can change the strength of the magnetic field H applied to the magnetoresistive effect element 41 and thereby change the resonant frequency f0 of the magnetoresistive effect element 41. Note that although a single magnetic field generating wire 31 is formed so as to pass through inside the magnetic yoke 32 in the present embodiment, the strength of the magnetic field H can be increased by using a construction where the magnetic field generating wire 31 is formed in a coil so that a multiple number of magnetic field generating wires 31 pass inside the magnetic yoke 32.

The current supplying unit 43 generates a DC current I1 and supplies the generated DC current I1 via the coil 44 to the upper electrode 25 and the lower electrode 26. By doing so, the DC current I1 is supplied to the magnetoresistive effect element 41 and flows through the free magnetic layer 21, the spacer layer 22, the fixed magnetic layer 23, and the antiferromagnetic layer 24 that are stacked in layers. As shown in FIG. 2, one end of the capacitor 45 is connected to the upper electrode 25.

With this construction, in the signal generating unit 11, in a state where a magnetic field H is supplied (applied) from the magnetic field applying unit 42 and the DC current I1 is being supplied from the current supplying unit 43, the magnetoresistive effect element 41 will self-oscillate with a frequency f2. Accordingly, in the receiver apparatus RX, the signal generating unit 11 functions as a so-called local oscillator and generates a local signal (second high frequency signal) S2 with a frequency of f2 and outputs the generated local signal S2 via the capacitor 45. By raising the impedance of the current supplying unit 43-side for the local signal S2 generated in this way, the coil 44 functions so as to reduce leakage of the local signal S2 to the current supplying unit 43.

As shown in FIG. 1, the mixer 1 includes a magnetoresistive effect element 2, a magnetic field applying unit 3, impedance converting units 4, 5, an addition unit 6, and an impedance converting unit 7. The impedance converting unit (second impedance converting unit) 4 is constructed as a passive impedance converting unit constructed of only passive components (i.e., does not include active elements). The impedance converting unit 4 is disposed between the antenna 101 and one input terminal of the addition unit 6 and matches the output impedance (as one example, 50Ω) of the antenna 101 to the characteristic impedance of a transfer line L1 (as one example, a microstrip line) connected to such input terminal of the addition unit 6 (i.e., to the input impedance (300Ω) of such input terminal of the addition unit 6). That is, the impedance converting unit 4 converts the inputted signal to a higher impedance than the input impedance (i.e., a higher impedance than 50Ω, and preferably an impedance of at least 300Ω) and outputs the converted signal. As one example in the present embodiment, the impedance converting unit 4 is constructed of a transformer-type impedance converting circuit (as a specific example, one balun transformer) and in addition to carrying out the impedance matching described above, converts the RF signal $S_{RF}$ outputted from the antenna 101 as a balanced signal to the RF signal S1 as an unbalanced signal and outputs to the transfer line L1.

The impedance converting unit (third impedance converting unit) 5 is constructed as a passive impedance converting unit constructed of only passive components (i.e., does not include active elements). The impedance converting unit 5 is disposed between the signal generating unit 11 and a transfer line L2 (as one example, a microstrip line) connected to the other input terminal of the addition unit 6 and matches the output impedance of the signal generating unit 11 to the impedance of the transfer line L2 (the input impedance (300Ω) of the other input terminal of the addition unit 6). That is, the impedance converting unit 5 converts the inputted signal to a higher impedance than the input impedance (i.e., a higher impedance than 50Ω, and preferably an impedance of at least 300Ω) and outputs the converted signal. Accordingly, when the output impedance of the signal generating unit 11 is a different value to the characteristic impedance (300Ω) of the transfer line L2, the impedance converting unit 5 is disposed between the signal generating unit 11 and the transfer line L2 and matches the impedance between the signal generating unit 11 and the transfer line L2. On the other hand, when the output impedance of the signal generating unit 11 is the same value or substantially the same value as the characteristic impedance (300Ω) of the transfer line L2, since it is possible to directly connect the signal generating unit 11 and the transfer line L2, the impedance converting unit 5 is omitted.

In the present embodiment, as described above, since a construction using the magnetoresistive effect element 41 is adopted for the signal generating unit 11, the output impedance is set at around 300Ω. Accordingly, in the mixer 1 according to the present embodiment, a construction is used where the impedance converting unit 5 is omitted and the signal generating unit 11 (more specifically, the capacitor 45 disposed at the output stage) is directly connected to the transfer line L2 (whose characteristic impedance is 300Ω). By doing so, the local signal S2 outputted from the signal generating unit 11 is directly inputted via the transfer line L2 into the addition unit 6.

As one example, the addition unit 6 is constructed by using a power splitter or a power divider as a power combiner. By using this construction, the addition unit 6 adds the two signals, i.e., the RF signal S1 and the local signal S2, inputted from the two input terminals to combine such signals into a single signal (addition signal) S12 which is outputted from an output terminal to a transfer line L3 (as one example, a microstrip line). The signal S12 is supplied via the transfer line L3 to the upper electrode 25 that is connected to the magnetoresistive effect element 2. For this reason, the characteristic impedance of the transfer line L3 is set at 300Ω which is the same as the impedance of the magnetoresistive effect element 2.

Although the magnetoresistive effect element 2 of the mixer 1 is a separate element to the magnetoresistive effect element 41 of the signal generating unit 11, as one example in the present embodiment, the magnetoresistive effect element 2 includes the same component elements as the magnetoresistive effect element 41 and has the same construction as the magnetoresistive effect element 41. Accordingly, regarding the construction of the magnetoresistive effect element 2, reference is made to the drawing used when describing the magnetoresistive effect element 41, component elements that are the same have been assigned the same numerals and only the main component elements will be described.

As one example, the magnetoresistive effect element 2 is constructed of a TMR element including a free magnetic layer 21 as shown in FIGS. 3 and 5. More specifically, the magnetoresistive effect element 2 includes the free magnetic layer 21, the spacer layer 22, the fixed magnetic layer 23, and the antiferromagnetic layer 24 that are laminated in the mentioned order and are disposed between an upper electrode 25 and a lower electrode 26 in a state where the free magnetic layer 21 is connected to the upper electrode 25 and the antiferromagnetic layer 24 is connected to the lower electrode 26. Note that although the upper electrode 25 and the lower electrode 26 are separate to the upper electrode 25 and the lower electrode 26 connected to the magnetoresistive effect element 41 of the signal generating unit 11, since such elements are described using the same drawing, the same reference numerals have been used.

As one example, as shown in FIG. 3, the fixed magnetic layer 23 is constructed of a ferromagnetic layer (second magnetic layer) 23a whose magnetic orientation is fixed, a non-magnetic layer 23b made of a metal such as ruthenium (Ru), and another ferromagnetic layer (first magnetic layer) 23c whose magnetic orientation is fixed in the opposite direction to the magnetic orientation of the ferromagnetic layer 23a, such layers being laminated in the mentioned order so that the ferromagnetic layer 23c is positioned above the antiferromagnetic layer 24.

Also, as shown in FIG. 4, in order to facilitate resonance of the magnetic orientation of the free magnetic layer 21 of the magnetoresistive effect element 2, the positional relationship between the magnetoresistive effect element 2 and the magnetic field applying unit 3 is set in advance so that the orientation of the axis of easy magnetization F of the free magnetic layer 21 and the orientation of the magnetic field H applied from the magnetic field applying unit 3 (described later) intersect at a predetermined angle θ (preferably an angle in a range of 5° to 175°, inclusive, and more preferably 90°) on an X-Y plane.

Although the magnetic field applying unit 3 is separate to the magnetic field applying unit 42 of the signal generating unit 11, as shown in FIGS. 1 and 5, the magnetic field applying unit 3 includes the magnetic field generating wire 31, the magnetic yoke 32, and the current supplying unit 33, and therefore has the same construction as the magnetic field applying unit 42. More specifically, as shown in FIG. 5, the magnetic field generating wire 31 of the magnetic field applying unit 3 is disposed above the magnetoresistive effect element 2 with the upper electrode 25 in between. The magnetic yoke 32 includes a top magnetic body 32a, side magnetic bodies 32b, 32c, lower magnetic bodies 32d, 32e, and bottom magnetic bodies 32f, 32g.

With the construction described above, the magnetic yoke 32 of the magnetic field applying unit 3 forms a closed magnetic path for the magnetic field that is generated in the region of the magnetic field generating wire 31 when a current I flows in the magnetic field generating wire 31. As shown in FIG. 4, the magnetic yoke 32 applies a magnetic field H to the free magnetic layer 21 of the magnetoresistive effect element 2 disposed at the position of a gap in the closed magnetic path (i.e., the gap between the pair of bottom magnetic bodies 32f, 32g). Also, in the present embodiment, as one example, the magnetic field generating wire 31 and the magnetic yoke 32 of the magnetic field applying unit 3 described above are formed together with the magnetoresistive effect element 2 on a silicon wafer in an IC form by a well-known semiconductor manufacturing process.

The current supplying unit 33 that constructs the magnetic field applying unit 3 is connected to both ends of the magnetic field generating wire 31 that protrude from both sides of the top magnetic body 32a and supplies the current I to the magnetic field generating wire 31. The current supplying unit 33 is constructed so that the magnitude of the current I can be changed. Accordingly, by changing the magnitude of the current I outputted from the current supplying unit 33, the magnetic field applying unit 3 can change the strength of the magnetic field H applied to the magnetoresistive effect element 2 and thereby change the resonant frequency f0 of the magnetoresistive effect element 2. Note that although a single magnetic field generating wire 31 is formed so as to pass through inside the magnetic yoke 32 in the present embodiment, the strength of the magnetic field H can be increased by using a construction where the magnetic field generating wire 31 is formed in a coil so that a multiple number of magnetic field generating wires 31 pass inside the magnetic yoke 32.

According to this construction, with the mixer 1, as described later, by matching the resonant frequency f0 of the magnetoresistive effect element 2 to the frequency f2 of the local signal S2 and setting the frequency f1 of the RF signal S1 to a frequency in the vicinity of the frequency f2, the magnetoresistive effect element 2 carries out a square-law detection operation on the RF signal S1 and the local signal S2 included in the signal S12 outputted from the addition unit 6 to generate and output a multiplication signal (voltage signal) S4. The multiplication signal S4 as the square-law detection output includes a DC component and various frequency (AC) components ((f1+f2), (f1−f2), 2×f1, 2×f2, 3×f1, 3×f2, . . . ).

In this case, leakage of the DC component generated in the magnetoresistive effect element 2 by the square-law detection operation to the antenna 101 is prevented by the impedance converting unit 4 constructed of a transformer-type impedance converting circuit and leakage of the DC component to the signal generating unit 11 is prevented by the capacitor 45 that is disposed at the output stage of the signal generating unit 11.

The impedance converting unit (first impedance converting unit) 7 is constructed as a passive impedance converting unit constructed of only passive components (i.e., does not include active elements). As one example in the present embodiment, the impedance converting unit 7 is constructed using a transformer-type impedance converting circuit. By connecting via a transfer line L4 (as one example, a microstrip line) to the magnetoresistive effect element 2 and connecting via a transfer line L5 (as one example, a microstrip line) to the amplifier 12, the impedance converting unit 7 is disposed between the magnetoresistive effect element 2 and the amplifier 12 and matches the impedance between the transfer line L4 whose characteristic impedance is set equal to the output impedance (300Ω) of the magnetoresistive effect element 2 and the transfer line L5 whose characteristic impedance is set equal to the input impedance (as one example, 50Ω) of the amplifier 12. That is, the impedance converting unit 7 converts the inputted signal to a lower impedance than the input impedance and outputs the converted signal.

As one example, the impedance converting unit 7 includes a pair of coils 7a, 7b that are magnetically coupled to one another, with one end of each of the coils 7a, 7b being grounded, the other end of one coil (7a) being connected via the transfer line L4 to the upper electrode 25 of the magnetoresistive effect element 2, and the other end of the other coil (7b) being connected via the transfer line L5 to the amplifier 12. According to this construction, the impedance converting unit 7 converts the impedance of the multiplication signal S4 from the magnetoresistive effect element 2 inputted via the transfer line L4 and outputs as a multiplication signal S5 to the transfer line L5 while removing the DC component included in the multiplication signal S4 and producing hardly any distortion of the AC components. Note that the coils 7a, 7b described above can be constructed of wire but can also be constructed by forming two spiral coils adjacently in a wiring pattern on the same substrate.

The amplifier 12 is constructed using an operational amplifier, for example, amplifies the multiplication signal S5 inputted via the transfer line L5 with a gain set in advance, and outputs as an output signal S6 to a transfer line L6 (as one example, a microstrip line with a characteristic impedance of 50Ω). In this case, the output impedance of the amplifier 12 is set at a value that matches the characteristic impedance of the transfer line L6. The filter 13 is constructed of a band-pass filter (BPF) for example, is disposed on the transfer line L6, and, by passing only desired frequencies out of the output signal S6, outputs as the final multiplication signal S3 to the output terminal 14. More specifically, the filter 13 passes a signal with a frequency (the desired frequency fm) out of the frequencies (f1−f2), (f1+f2) as the multiplication signal S3.

Figure 6:
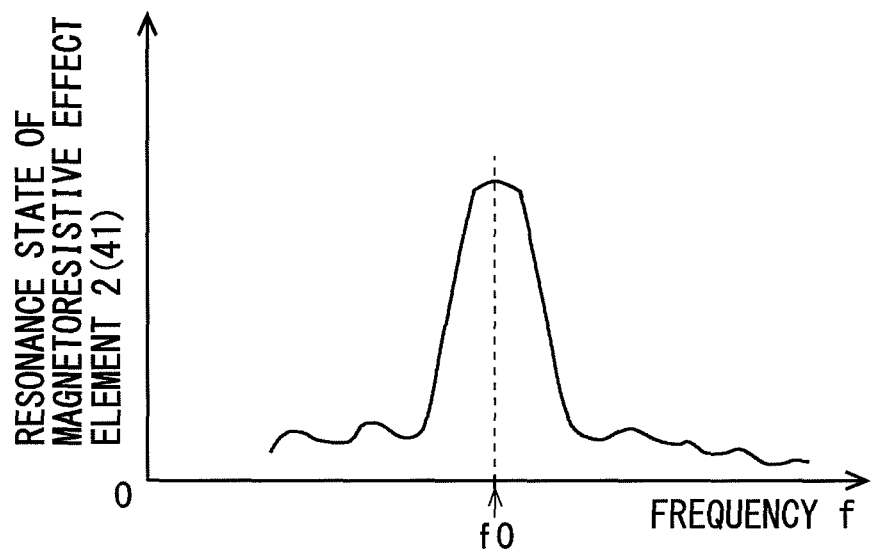
FIG. 6 is a graph showing the relationship between the frequency and the resonance state of the magnetoresistive effect element when the magnetic field applied to the magnetoresistive effect element is fixed.

Next, a mixing operation by the mixer 1 and a frequency converting operation by the frequency converting apparatus 100 will be described. As one example, it is assumed that the RF signal $S_{RF}$ (with a frequency f1=4.5 GHz) received via the antenna 101 is inputted and, by setting the resonant frequency f0 (see FIG. 6) of the magnetoresistive effect element 41 at the frequency f2 (=4.4 GHz(<f1)), the signal generating unit 11 generates the local signal S2 with the frequency f2. Also, the resonant frequency f0 (see FIG. 6) of the magnetoresistive effect element 2 should preferably exhibit a peak at the frequency f2 of the local signal S2. For this reason, it is assumed that the current value of the current I supplied from the current supplying unit 33 to the magnetic field generating wire 31 of the mixer 1 is set at a value that enables a magnetic field H for matching the resonant frequency f0 to the frequency f2 of the local signal S2 to be applied to the magnetoresistive effect element 2.

It is also assumed that the local signal S2 is set at a power (for example, −15 dBm±5 dBm) that is able to supply a current capable of causing the magnetoresistive effect element 2 to resonate. Also, although the frequency components (f1, f2) of the signals S1, S2 and the various frequency components of the multiplication signals ((f1+f2), (f1−f2), 2×f1, 2×f2, 3×f1, 3×f2, . . . ) are included in the output signal S5 outputted from the impedance converting unit 7 due to the mixing operation by the mixer 1, it is assumed that the filter 13 is constructed so that the desired frequency component out of such frequency components (the frequency component (f1+f2) or the frequency component (f1−f2), as one example in the present embodiment, the higher frequency component (f1+f2)) is passed and the passage of signals of other frequencies can be prevented. In such case, the filter 13 is constructed of a band-pass filter where the frequency (f1+f2) is included in the frequency band.

In this frequency converting apparatus 100, due to the magnetic field H supplied (applied) from the magnetic field applying unit 42 to the magnetoresistive effect element 41 and the DC current I1 supplied from the current supplying unit 43, the signal generating unit 11 generates and outputs the local signal S2 with the frequency f2. The local signal S2 is outputted to the mixer 1 in a state where the current I is being supplied from the current supplying unit 33 (a state where the magnetic field H is being applied to the magnetoresistive effect element 2).

In the present embodiment, as described above, by adopting a construction using the magnetoresistive effect element 41, the output impedance of the signal generating unit 11 is set at the same value as the input impedance (300Ω) of the other input terminal of the addition unit 6 and the characteristic impedance of the transfer line L2 that connects the signal generating unit 11 and the other input terminal of the addition unit 6 is matched to the output impedance of the signal generating unit 11 and the input impedance of the other input terminal of the addition unit 6. The output impedance of the addition unit 6 is set at 300Ω and the impedance of the transfer line L3 that connects the addition unit 6 and the magnetoresistive effect element 2 is matched to the impedance of the magnetoresistive effect element 2. This means that the local signal S2 outputted from the signal generating unit 11 is inputted into the addition unit 6 in a state where there is extremely little distortion, and is outputted via the transfer line L3 to the magnetoresistive effect element 2 of the mixer 1 in a state where the local signal S2 is included in the signal S12 from the addition unit 6. Here, as described above, the local signal S2 is set so that the frequency f2 thereof matches the resonant frequency f0 of the magnetoresistive effect element 2 and so that the power thereof is capable of causing the magnetoresistive effect element 2 to resonate. Accordingly, strong resonance (spin torque ferromagnetic resonance) of the magnetoresistive effect element 2 is caused.

In this resonance state, when the outputting of the RF signal $S_{RF}$ (with the frequency f1) from the antenna 101 into the impedance converting unit 4 starts, the impedance converting unit 4 constructed of a balun transformer converts the RF signal $S_{RF}$ that is a balanced signal to the RF signal S1 as an unbalanced signal and outputs via the transfer line L1 to one input terminal of the addition unit 6. In the present embodiment, since the output impedance of the impedance converting unit 4 is matched to the characteristic impedance of the transfer line L1, the RF signal S1 is inputted into the addition unit 6 in a state where there is extremely little distortion, and is outputted via the transfer line L3 to the magnetoresistive effect element 2 of the mixer 1 in a state where the signal is included in the signal S12 from the addition unit 6.

In this case, in the resonance state the magnetoresistive effect element 2 manifests a square-law detection operation (rectification operation) which has a very small forward voltage compared to a semiconductor pn junction diode. This means that even in a state where the power of the local signal S2 for causing the forward voltage to be generated in the magnetoresistive effect element 2 is lower than the power (for example, 10 dBm) required when a semiconductor pn junction diode is used, the magnetoresistive effect element 2 carries out a square-law detection operation to multiply the RF signal S1 and the local signal S2 and thereby generate the multiplication signal S4 across both ends thereof.

When doing so, in the present embodiment, since the output impedance of the addition unit 6 connected to the magnetoresistive effect element 2 and the input impedance of the impedance converting unit 7 are matched to the impedance (300Ω) of the magnetoresistive effect element 2, compared to a construction where the magnetoresistive effect element 2 is directly connected to a transfer line with a low characteristic impedance such as 50Ω, the magnetoresistive effect element 2 generates the multiplication signal S4 with a larger amplitude.

Next, the impedance converting unit 7 inputs the multiplication signal S4 via the transfer line L4, matches the multiplication signal S4 to the characteristic impedance of the transfer line L5, and outputs with low distortion as the multiplication signal S5. The multiplication signal S5 is inputted via the transfer line L5 into the amplifier 12. In this way, since the characteristic impedance of the transfer line L4 on the magnetoresistive effect element 2 side and the characteristic impedance of the transfer line L5 on the amplifier 12 side are matched by the impedance converting unit 7, the multiplication signal S5 is inputted into the amplifier 12 in a state with extremely low distortion, and more specifically a state with little distortion for third harmonic distortion components that is one standard for performance evaluation of the mixer 1.

Next, the amplifier 12 amplifies the inputted multiplication signal S5 and outputs to the transfer line L6 as the output signal S6. Finally, by passing only the component with the frequency (f1+f2) out of the frequency components included in the output signal S6, the filter 13 outputs to the output terminal 14 as the final multiplication signal S3.

In this way, the mixer 1 and the frequency converting apparatus 100 include the passive impedance converting unit 7 that inputs the multiplication signal S4 outputted from the magnetoresistive effect element 2 of the mixer 1 with the same input impedance as the impedance of the magnetoresistive effect element 2, converts the multiplication signal S4 to an impedance that matches the characteristic impedance of the transfer line L5 disposed between the mixer 1 and the amplifier 12 that follows downstream (that is, an impedance that is equal to the input impedance of the amplifier 12 that is lower than the impedance of the magnetoresistive effect element 2), and outputs as the multiplication signal S5. Therefore, according to the mixer 1 and the frequency converting apparatus 100, even when the impedance of the magnetoresistive effect element 2 and the characteristic impedance of the transfer line L5 (that is, the input impedance of the amplifier 12) differ, it is possible to reliably avoid the generation of distortion caused by mismatching of the magnetoresistive effect element 2 and the transfer line L5 and to output the multiplication signal S4 outputted from the magnetoresistive effect element 2 to the transfer line L5 as the multiplication signal S5 (that is, it is possible to input into the amplifier 12 as the multiplication signal S5). Also, since extremely little distortion is generated in the impedance converting unit itself compared to an active impedance converting unit, it is possible to convert the multiplication signal S4 to the multiplication signal S5 and input into the amplifier 12 with significantly less distortion.

Also, the mixer 1 and the frequency converting apparatus 100 include the passive impedance converting unit 7 constructed of only a transformer-type impedance converting circuit as a passive component. Therefore, according to the mixer 1 and the frequency converting apparatus 100, compared to an impedance converting unit that uses resistance, it is possible to minimize the attenuation of the multiplication signal S4 in the impedance converting unit 7 and to output to the transfer line L5 having removed the DC component included in the multiplication signal S4.

According to the frequency converting apparatus 100, by including the mixer 1 described above and the filter 13 that passes one (in the construction described above, f1+f2) out of the frequencies (f1+f2) and (f1−f2) out of the frequency components included in the multiplication signal S6, it is possible to cause the frequency converting apparatus 100 to function as an upconverting apparatus. Note that by constructing the filter 13 from a band-pass filter (BPF) that passes only the signal with the frequency (f1−f2), it is also possible to cause the frequency converting apparatus 100 to function as a down-converting apparatus.

Also, according to the frequency converting apparatus 100, by constructing the signal generating unit 11 of the magnetoresistive effect element 41, the magnetic field applying unit 42 that applies a magnetic field to the magnetoresistive effect element 41, and the current supplying unit 43 that supplies the DC current I1 to the magnetoresistive effect element 41, it is possible to match the impedance of the local signal S2 outputted from the signal generating unit 11 to the impedance of the magnetoresistive effect element 2 without using the impedance converting unit 5.

Figure 7:
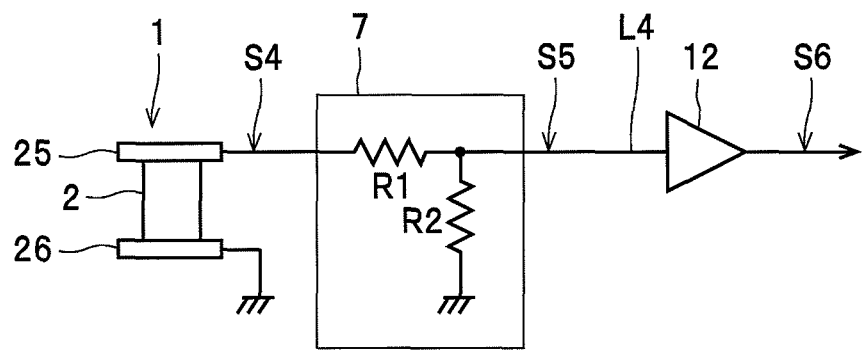
FIG. 7 is a circuit diagram showing another example of an impedance converting unit.

Note that as the impedance converting unit 7, it is also possible to use a resistance-type impedance converting circuit in place of a transformer-type impedance converting circuit. A resistance-type impedance converting circuit will be described with reference to FIG. 7, and such resistance-type impedance converting circuit is constructed so as to include a resistance R1 connected in series between the upper electrode 25 of the mixer 1 and the transfer line L4 and a resistance R2 connected between the transfer line L4-side terminal of the resistance R1 and ground, with the resistance value of the resistance R1 set at 273.9Ω and the resistance value of the resistance R2 set at 54.8Ω. By using this construction, the impedance converting unit 7 constructed of a resistance-type impedance converting circuit has an input impedance of 300Ω for the mixer 1 and the output impedance is set at 50Ω for the transfer line L4 whose characteristic impedance is 50Ω. Accordingly, although the multiplication signal will attenuate compared to a transformer-type impedance converting circuit, in the same way as when a transformer-type impedance converting circuit is used, it is possible to convert the multiplication signal S4 to the same impedance as the input impedance of the amplifier 12 that follows downstream and output as the multiplication signal S5 with little distortion. In such case, the resistances R1, R2 may be constructed of resistors as electronic components or may be constructed of microstrip lines formed on a substrate with characteristic impedances that are set in advance.

What is claimed is:

1. A mixer comprising:
   an adder that inputs a first high-frequency signal and a second high-frequency signal for local use, adds the first high-frequency signal and the second high-frequency signal, and outputs as an addition signal;
   a magnetoresistive effect element that includes a fixed magnetic layer, a free magnetic layer, and a non-magnetic spacer layer disposed between the fixed magnetic layer and the free magnetic layer, and is operable when the addition signal has been inputted, to multiply the first high-frequency signal and the second high-frequency signal included in the addition signal using a magnetoresistive effect to generate a multiplication signal;
   a magnetic field applying unit that applies a magnetic field to the free magnetic layer; and
   a first impedance converting unit that is passive, inputs the multiplication signal outputted from the magnetoresistive effect element, converts the multiplication signal to a lower impedance than an input impedance, and outputs the converted multiplication signal.

2. The mixer according to claim 1,
   wherein the first impedance converting unit includes one of a transformer-type impedance converting circuit and a resistance-type impedance converting circuit.

3. A frequency converting apparatus comprising:
   the mixer according to claim 2; and
   a filter passing one frequency out of (f1+f2) and (f1−f2) out of the multiplication signal, where f1 is the frequency of a higher frequency signal out of the first high-frequency signal and the second high-frequency signal and f2 is the frequency of a lower frequency signal.

4. The frequency converting apparatus according to claim 3,
   further comprising a signal generating unit that generates the second high-frequency signal,
   wherein the signal generating unit includes:
   a second magnetoresistive effect element including a fixed magnetic layer, a free magnetic layer, and a non-magnetic spacer layer disposed between the fixed magnetic layer and the free magnetic layer;
   a second magnetic field applying unit that applies a magnetic field to the free magnetic layer of the second magnetoresistive effect element; and
   a current supplying unit that supplies a DC current to the second magnetoresistive effect element,
   wherein the second high-frequency signal is generated by spin injection self-oscillation by the second magnetoresistive effect element.

5. A frequency converting apparatus comprising:
   the mixer according to claim 1; and a filter passing one frequency out of (f1+f2) and (f1−f2) out of the multiplication signal, where f1 is the frequency of a higher frequency signal out of the first high-frequency signal and the second high-frequency signal and f2 is the frequency of a lower frequency signal.

6. The frequency converting apparatus according to claim 5, further comprising a signal generating unit that generates the second high-frequency signal, wherein the signal generating unit includes:

a second magnetoresistive effect element including a fixed magnetic layer, a free magnetic layer, and a non-magnetic spacer layer disposed between the fixed magnetic layer and the free magnetic layer;

a second magnetic field applying unit that applies a magnetic field to the free magnetic layer of the second magnetoresistive effect element; and a current supplying unit that supplies a DC current to the second magnetoresistive effect element, wherein the second high-frequency signal is generated by spin injection self-oscillation by the second magnetoresistive effect element.

* * * * *